United States Patent [19]
Suda et al.

[11] Patent Number: 5,686,207
[45] Date of Patent: Nov. 11, 1997

[54] METHOD OF FORMING AND REPAIRING A MASK FOR PHOTOLITHOGRAPHY

[75] Inventors: Masayuki Suda; Akito Ando; Tatsuaki Ataka, all of Chiba, Japan

[73] Assignee: Seiko Instruments Inc., Japan

[21] Appl. No.: 504,372

[22] Filed: Jul. 19, 1995

[30] Foreign Application Priority Data

Aug. 8, 1994 [JP] Japan .................. 6-186100
Aug. 8, 1994 [JP] Japan .................. 6-186101

[51] Int. Cl.⁶ ............................ G03F 9/00
[52] U.S. Cl. .................. 430/5; 205/70; 205/80; 205/115; 205/135
[58] Field of Search .............. 430/5; 205/115, 205/135, 80, 70

[56] References Cited

U.S. PATENT DOCUMENTS

| | | |
|---|---|---|
| 4,530,891 | 7/1985 | Nagarekawa et al. .............. 430/5 |
| 4,919,971 | 4/1990 | Chen .......................... 205/115 |
| 4,994,154 | 2/1991 | Chen et al. ................... 205/115 |

*Primary Examiner*—Thorl Chea
*Attorney, Agent, or Firm*—Adams & Wilks

[57] ABSTRACT

A method of forming a mask for photolithography comprises forming a transparent conductive film on a transparent substrate. The substrate and an electrode having a sharp front end are immersed in an electrolytic solution. The sharp front end of the electrode and the transparent film are then positioned close to each other while controlling a distance therebetween. The substrate and the electrode are then scanned relative to each other in two-dimensions while maintaining the distance between the sharp front end of the electrode and the transparent film constant. Thereafter, an electrochemical reaction is processed on the substrate while a voltage is applied between the transparent film and the electrode to form a mask pattern on the substrate. During repair of the mask thus formed, the substrate and the electrode are immersed in the electrolytic solution. The sharp front end of the electrode and a portion of the mask pattern to be repaired are positioned close to one another, and a distance between the sharp front end of the electrode and the mask pattern is controlled by detecting a tunnelling current flowing therebetween. Thereafter, a voltage is applied between the electrode and the mask pattern to either deposit a pattern material onto the portion of the mask pattern to be repaired or to dissolve a pattern material from the portion of the substrate pattern to be repaired.

16 Claims, 4 Drawing Sheets

METHOD OF FORMING AND REPAIRING A MASK FOR PHOTOLITHOGRAPHY

BACKGROUND OF THE INVENTION

This invention relates to a method of working a mask, especially of fabricating and repairing a mask, used for a photolithography process in the field of accurate machining and electronic industry.

In the semiconductor industry or in other industry, numerous fabrication processes utilizing photolithography are performed. Masks used for these processes are manufactured by evaporating a thin metal film of chromium on glass or quartz glass and then patterning the film by some method. Generally, three methods are available to pattern the thin film.

The first method makes use of photolithography employing photo-reduction exposure. In this method, a master mask having a pattern which has the same shape as a mask pattern to be formed but, having enlarged size is prepared. This pattern is demagnified and projected onto a resist. In this way, the mask is patterned. In this case, the master mask for fabricating the desired mask and the photoresist are necessary.

The second method exploits an electron beam. In particular, a photoresist sensitive to the electron beam is applied to the top surface of a thin metal film. The resist is directly exposed by the sharply focused electron beam while scanning the beam. In this way, a pattern is created. In this case, no master mask is necessitated but a photoresist is required.

The third method uses a focused ion beam. A pattern is created while scanning the ion beam, in the same way as the electron beam. However, the resist is not exposed to light. Rather, a thin metal film is directly removed by the ion beam. Therefore, neither a mask nor a photoresist is necessary.

Another method consists of applying a photosensitive resin on a glass substrate and directly exposing and developing the resin to form a mask. This method is often used because it is simple.

On the other hand, during the fabrication of the above-described mask, those portions which should be transparent to light may block light (opaque defects), or conversely, those portions which should be opaque to light may transmit light (clear defects) because of incorrect designing or process troubles. In these cases, it is unlikely that the process sequence for the mask is restarted from the beginning. Rather, it is a common practice to repair only defective portions.

In this case, a method which has been used in the past makes use of a focused ion beam. Where this focused ion beam is used, if opaque defects are to be repaired, the defects are irradiated with the ion beam to directly remove the thin metal film (ion milling). If clear defects are to be repaired, a gas is introduced into a vacuum vessel. The defects are irradiated with the ion beam to deposit decomposition products from the gas.

Furthermore, a technique using laser radiation instead of the focused ion beam to perform similar operations has been developed.

As mentioned previously, three methods are conventionally available to fabricate masks. In the first method using photolithography utilizing photo-reduction exposure, a separate master mask is needed to fabricate a desired mask. Furthermore, the photo-reduction exposure is expensive and so the cost of fabricating the mask is increased. In the second method using an electron beam, it is necessary to place the mask substrate in a vacuum ambient because the electron beam is used. Again, the equipment cost is increased. With any of these methods, when a patterning operation is carried out, a photoresist is required. Consequently, the accuracy and resolution depend on the performance of the resist.

In the third method, or direct writing method, using the focused ion beam, neither a mask nor a resist is necessary. However, a vacuum ambient is still necessitated. Therefore, the equipment cost is increased. In addition, it is more difficult to sharply focus an ion beam than an electron beam. Consequently, it is impossible to enhance the resolution greatly. Moreover, the processing speed is not very high. This presents another problem. That is, a relatively long time is needed. On the other hand, the method using a focused ion beam is widely used to repair a mask used for photolithography. However, this method also presents similar problems.

Where the photolithographic mask is repaired, using laser radiation instead of a focused ion beam, a vacuum vessel is dispensed with, because the operations can be performed within the atmosphere. Therefore, a relatively high-output laser is necessary. Consequently, the equipment cost is not reduced so much.

SUMMARY OF THE INVENTION

It is an object of the present invention to provide a method of working a mask used for photolithography with a fine pattern in an order of nanometers by making use of local electrochemical reactions.

It is another object of the present invention to provide a method of fabricating a mask for photolithography with a fine pattern in an order of nanometers by making use of local electrochemical reactions.

It is further an object of the present invention to provide a method of repairing a mask for photolithography having a clear defect and/or an opaque defect in an order of nanometers by making use of local electrochemical reactions.

It is still another object of the present invention to provide a method of working a mask used for photolithography by using a fine distance control means for working a pattern in an order of nanometers.

When a mask is fabricated, a mask substrate is fabricated by forming a transparent and electrically conductive film on a transparent substrate. Alternatively, a mask substrate is fabricated by forming a transparent and electrically conductive film on a transparent substrate and then forming an opaque and electrically conductive film on the transparent film. When a pattern is formed on this mask substrate, a working electrode shaped to have a sharp front end is immersed in an electrolytic solution, together with the mask substrate. In this way, a cell is formed. In this cell, the sharp front end of the mask substrate is located close to the patterned location on the mask substrate.

An appropriate voltage is applied between the mask substrate and the working electrode. An opaque material is deposited from the electrolytic solution onto the mask substrate, or conversely, the opaque conductive film on the mask substrate is electrochemically removed. At the same time, either the working electrode or the substrate is scanned. Thus, a pattern of the opaque material is formed on the mask substrate.

Similarly, when defects in a mask are repaired, the working electrode having the sharp front end is immersed in the electrolytic solution, along with the mask substrate. A cell in which the sharp front end of the working electrode is close to opaque or clear defects in the pattern on the mask substrate is formed.

An adequate voltage is impressed between the mask substrate and the working electrode. An opaque material is deposited from the electrolytic solution onto the mask substrate to repair the clear defects. Conversely, the opaque and conductive film on the mask substrate is electrochemically removed to repair the opaque defects. At this time, if necessary, either the working electrode or the substrate is scanned during this process.

In order to fabricate a mask used for photolithography, it is necessary to form a film having clear portions and opaque portions. The clear portions transmit light, while the dark portions block light. In the novel method of fabricating a photolithographic mask, electrochemical oxidation-reduction reactions are used as means for forming the clear and opaque portions. Where electrochemical reactions are used, it is necessary that the base material be electrically conductive, as can be seen from an example of electroplating and from other examples.

In the novel method of fabricating a photo-lithographic mask, the mask substrate itself is made of an insulator such as glass. Electrical conductivity is imparted to it by forming a transparent conductive film as made from ITO on the surface. In this way, the problem is solved. The unmasked transparent thin conductive film forms the clear portions which transmit light. The conductive film coated with an opaque material as consisting of a metal forms the opaque portions which block light. In the initial state, the whole substrate is either in a clear or opaque state. Therefore, electrochemical reactions are induced locally to form opaque or clear states. In this way, a pattern is created.

More specifically, the mask substrate and the working electrode are immersed in an electrolytic solution. The sharp front end of the working electrode is brought as close as possible to those portions of the mask substrate which are to be patterned. Under this condition, if an appropriate voltage is applied between the mask substrate and the working electrode, an opaque material such as a metal is deposited onto the mask substrate, or an opaque material on the mask substrate is dissolved away.

Locations at which these electrochemical reactions take place are limited to the vicinity of the front end of the working electrode. These operations are repeated while moving the working electrode along the surface of the mask substrate. As a result, a pattern is electrochemically formed on the mask substrate.

Those portions of the finished mask which should be transparent to light may block light (opaque defects), or conversely, those portions which should be opaque to light may transmit light (clear defects) because of incorrect designing or process troubles. Electrochemical reactions are locally induced by the novel method of repairing the photolithographic mask so as to form local opaque or clear states. In this way, defects are repaired.

In particular, in the same way as in the fabrication of a mask, the mask substrate and the working electrode are immersed in an electrolytic solution. The sharp front end of the working electrode is brought as close as possible to repaired portions of the mask substrate. Under this condition, if an appropriate voltage is applied between the mask substrate and the working electrode, an opaque material such as a metal is deposited onto the mask substrate, or an opaque material on the mask substrate is dissolved away. The locations at which these electrochemical reactions occur are limited to the vicinity of the front end of the working electrode. Only the portions to be repaired can be processed.

The diameter of the front end of the working electrode used for the above-described processes can be reduced to approximately 10 nm if electrolytic etching or another technique is used. The distance between the mask substrate and the working electrode can be controlled at an accuracy of the order of nanometers by making use of detection of a tunneling current. If these techniques are utilized, a mask can be fabricated and repaired at a resolution of the order of tens of nanometers.

In addition, in the novel method of fabricating and repairing a photolithographic mask, the fabrication and repair are made within a solution. Therefore, neither a special vacuum system nor an expensive laser light source is needed. Additionally, both fabrication and repair can be done by the same apparatus. Consequently, the fabrication cost can be suppressed greatly.

DETAILED DESCRIPTION OF THE PREFERRED EMBODIMENTS

The novel method and apparatus for processing of the present invention are hereinafter described with reference to the drawings.

(Embodiment 1)

Figure 1:
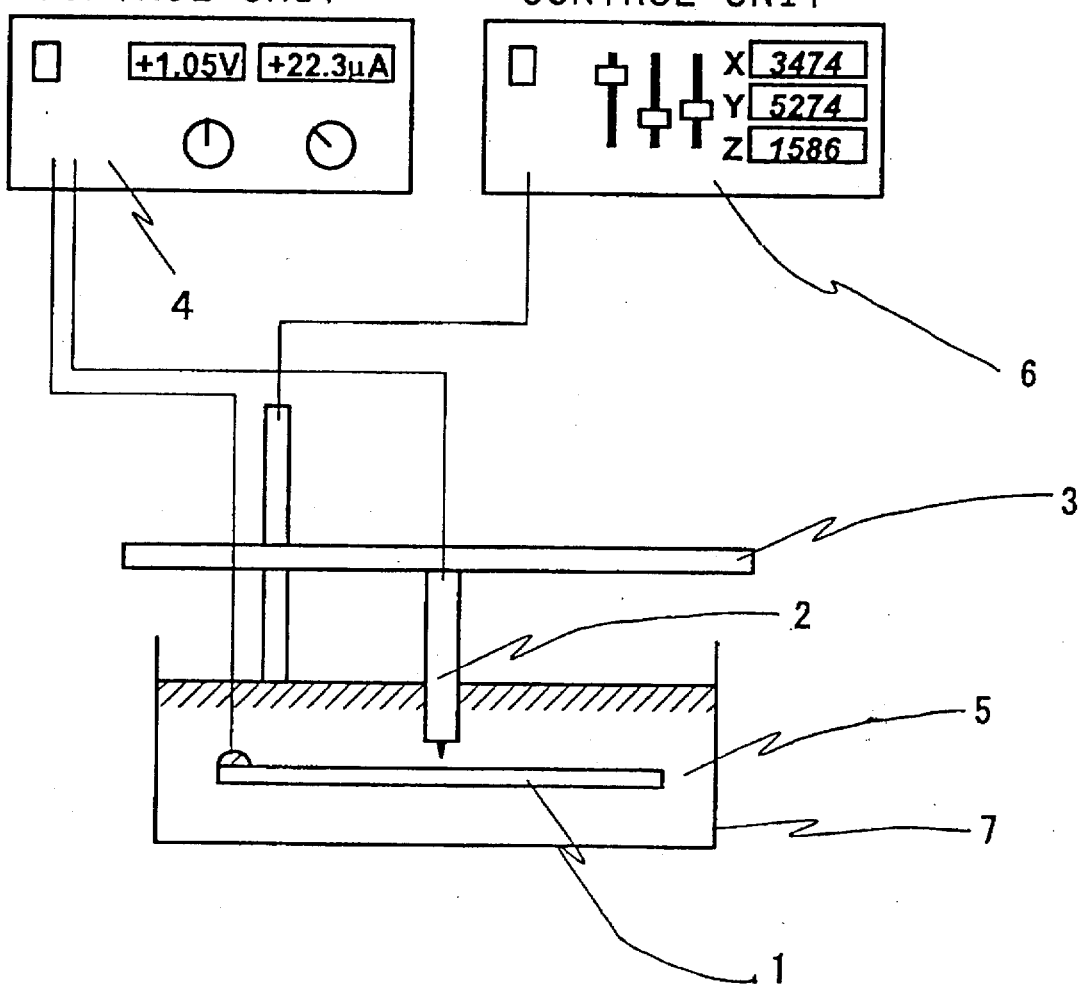
FIG. 1 is a schematic view illustrating one embodiment of a photolithographic fabrication method according to the present invention.

FIG. 1 pictorially shows an embodiment of a method for fabricating a mask used for photolithography according to the present invention. A mask substrate 1 and a working electrode 2 are immersed in an electrolytic solution 5 filling a vessel 7. The mask substrate 1 and the working electrode 2 are electrically connected with a current/voltage control unit 4. The working electrode 2 is shaped so as to have at least one sharp front end. Excluding the sharp front end, the electrode is coated with an insulator.

The working electrode 2 is held on a stage 3 which can be accurately moved into any arbitrary position in three dimensions over the mask substrate 1. The stage 3 is controlled by a position control unit 6. In this case, the mask substrate 1 is not moved. The working electrode 2 is supported by a moving mechanism. Conversely, the working electrode 2 can be at rest, and the mask substrate 1 can be supported by the moving mechanism.

Figure 2:
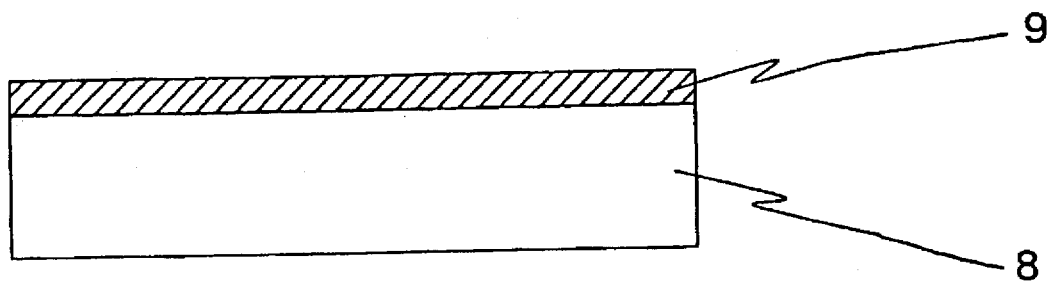
FIG. 2 is a schematic view of one embodiment of a mask substrate used in a photolithographic fabrication method according to the present invention.

FIG. 2 pictorially shows an embodiment of the structure of a mask substrate used in the method of fabricating a photolithographic mask according to the present invention. The whole mask substrate is in its initial state. That is, it is in a clear state, i.e., the substrate transmits light. A thin film of ITO 9 which is a transparent conductive film is formed on a glass substrate 8 by sputtering. The thickness of the ITO thin film 9 is 200 nm.

In the present embodiment, the transparent conductive material is ITO. Other materials such as tin oxide and zinc oxide can be used without difficulty. Furthermore, other methods such as vacuum evaporation can be used to form the thin film. The film thickness is such that pinholes are not generated, nor does the film greatly hinder transmission of light.

The used electrolytic solution 5 is obtained by dissolving 450 g of nickel sulfamate and 30 g of boric acid in 1 liter of deionized water. In the present embodiment, in order to deposit nickel as an opaque material, an electrolytic solution of the above-described composition is used. Where nickel is also deposited, an electrolytic solution of a different composition may also be used. Furthermore, an electrolytic solution containing ions of a metal such as chromium may be used.

First, the working electrode 2 is moved by the stage 3 into the position on the mask substrate 1 where a pattern should be formed. The space between the mask substrate 1 and the working electrode 2 is made sufficiently small. Then, an electrical current is passed between the substrate 1 and the electrode 2 by the current/voltage control unit 4 to deposit nickel on the surface of the mask substrate 1. Subsequently, the working electrode 2 is scanned along the surface of the mask substrate 1 such that the space therebetween is kept constant. As a result, nickel is deposited on the mask substrate 1 according to the orbit of scan. Hence, a pattern of opaque portions which do not transmit light can be created.

At this time, the electrical current flowing between both electrodes can be either a constant current or a pulsed current. In the present embodiment, a pulsed current is supplied, because it can provide a higher pattern resolution. These operations are repeated to form a desired pattern on the mask substrate.

(Embodiment 2)

Figure 3:
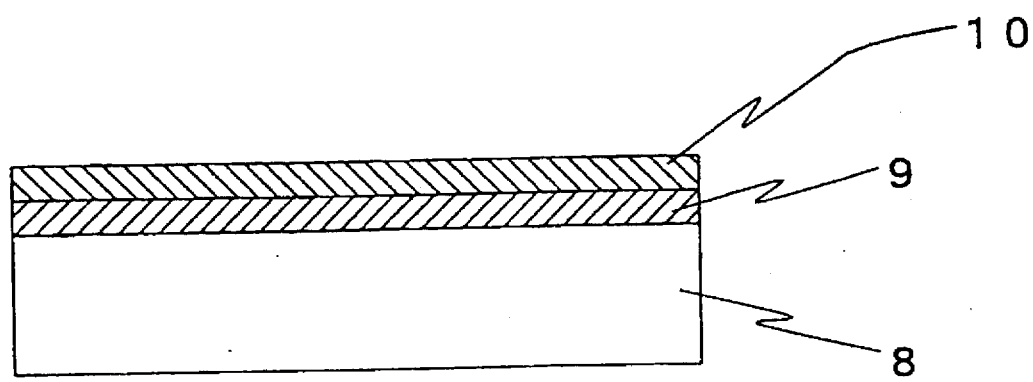
FIG. 3 is a schematic view of another embodiment of a mask substrate used in a photolithographic fabrication method according to the present invention.

FIG. 3 pictorially shows an embodiment of the structure of a mask substrate used in the method of fabricating a photo-lithographic mask according to the present invention. The whole mask substrate is in its initial state. That is, it is in an opaque state, i.e., the substrate does not transmit light. A thin film of ITO 9 which is a transparent conductive film is formed on a glass substrate 8 by sputtering. A thin chromium film 10 which is a thin opaque conduotive film is formed on the ITO film 9 by sputtering techniques. The thickness of the thin ITO film is 200 nm. The thin chromium film is 150 nm thick.

In the present embodiment, the transparent conductive material is ITO. Other materials and other thin film formation methods can be used as described in Embodiment 1. In addition, the opaque material is not limited to chromium. Other materials such as nickel and aluminum may be used without presenting problems.

The used electrolytic solution 5 is obtained by dissolving 135.3 g of sulfamic acid and 30 g of boric acid in 1 liter of deionized water. In the present embodiment, in order to dissolve chromium, an electrolytic solution of the above-described composition is used. An electrolytic solution of a different composition may also be used. Of course, where a material other than chromium is used as an opaque material, an electrolytic solution of a composition suited to the selected material is used.

The method of fabricating a mask is precisely the same as in Embodiment 1. Using the apparatus of the construction shown in FIG. 1, the working electrode 2 is move by the stage 3 into the position on the mask substrate 1 where a pattern should be formed. The space between the mask substrate 1 and the working electrode 2 is rendered sufficiently small.

Then, an electrical current is passed between the substrate 1 and the electrode 2 by the current/voltage control unit 4 to dissolve chromium from the surface of the mask substrate 1. Subsequently, the working electrode 2 is scanned along the surface of the mask substrate 1 such that the space is held constant. As a result, chromium is dissolved on the mask substrate 1 according to the orbit of scan. Hence, a pattern of clear portions which transmit light can be created.

At this time, the electrical current flowing between both electrodes can be either a constant current or a pulsed current. In the present embodiment, a pulsed current is supplied because it can provide a higher pattern resolution. These operations are repeated to form a desired pattern on the mask substrate.

(Embodiment 3)

Figure 4:
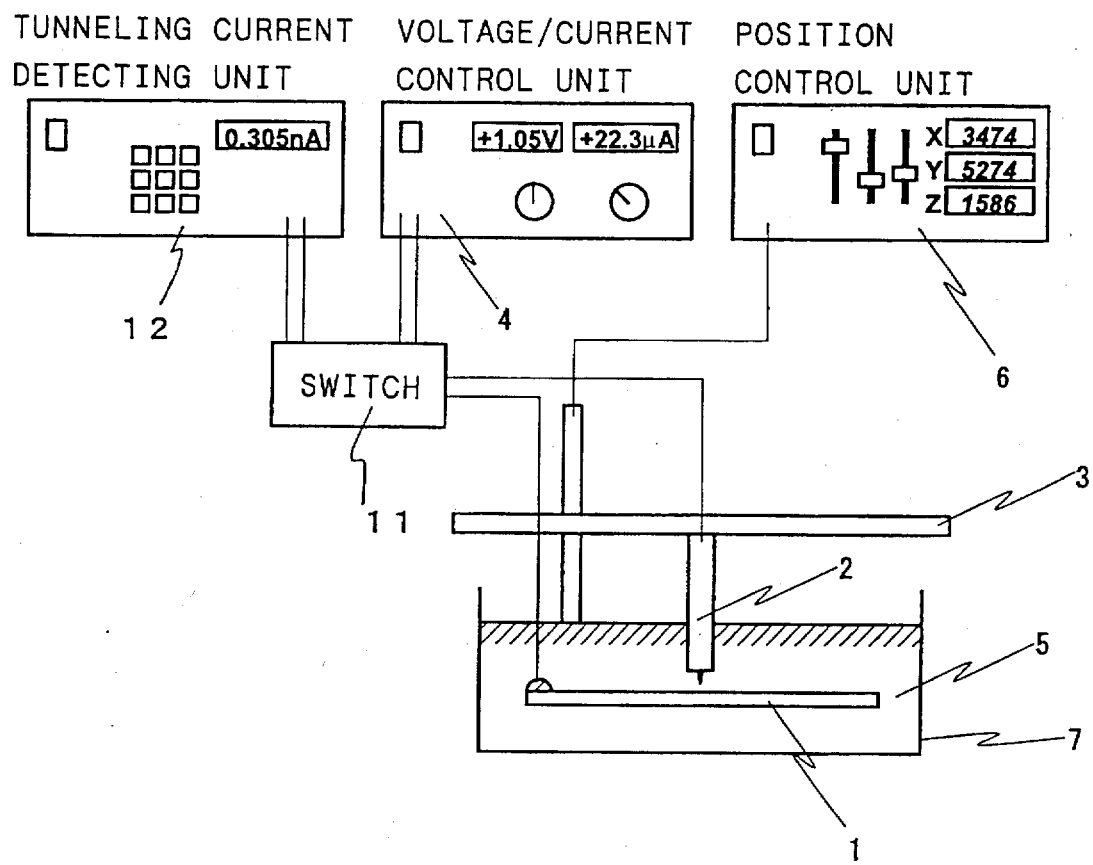
FIG. 4 is a schematic view illustrating another embodiment of a photolithographic fabrication method according to the present invention.

FIG. 4 pictorially shows an embodiment of a method for fabricating a photolithographic mask according to the present invention. A mask substrate 1 and a working electrode 2 are immersed in an electrolytic solution 5 filling a vessel 7. The mask substrate 1 and the working electrode 2 are electrically connected with a current/voltage control unit 4 via a switch 11. The working electrode 2 is shaped so as to have at least one sharp front end. Excluding the sharp front end, the working electrode is coated with an insulator.

The working electrode 2 is held on a stage 3 which can be accurately moved into any arbitrary position in three dimensions over the mask substrate 1. The stage 3 is controlled by a position control unit 6. In this case, the mask substrate 1 is not moved. The working electrode 2 is supported to a moving mechanism. Conversely, the working electrode 2 can be at rest, and the mask substrate 1 can be supported by the moving mechanism. The mask substrate 1 and the working electrode 2 are also connected with a tunneling current detecting unit 12 via the switch 11 to control the distance between the substrate and the electrode. The mode can be switched between a distance-measuring mode and a working mode by switching the state of the switch 11.

In the present embodiment, the mask substrate of the structure shown in FIG. 3 and an electrolytic solution of the same composition as used in Embodiment 2 are used, in the same way as in Embodiment 2.

First, the working electrode 2 is moved by the stage 3 into a position on the surface of the mask substrate 1 where a pattern is to be formed. Then, the switch 11 is switched to the state for establishing the distance-measuring mode. Under this condition, the mask substrate 1 and the working electrode 2 are electrically connected with the tunneling current detecting unit 12. The stage 3 is driven in the direction of the Z-axis until a certain tunneling current is detected. In this way, the working electrode 2 is brought close to the mask substrate 1. This mechanism makes it possible to control the distance between the substrate 1 and the electrode 2 at an accuracy of the order of nanometers.

Thereafter, the switch 11 is switched to the state for establishing the working mode. An electrical current is passed between the substrate 1 and the electrode 2 to dissolve chromium from the surface of the substrate 1. Subsequently, the working electrode 2 is scanned along the surface of the mask substrate 1 such that the space is kept constant. As a result, chromium is dissolved on the mask substrate 1 according to the orbit of scan. Hence, a pattern of clear portions which transmit light can be created.

At this time, the electrical current flowing between both electrodes can be either a constant current or a pulsed current. In the present embodiment, a pulsed current is supplied, because the resolution of patterns can be set higher. These operations are repeated to form a desired pattern on the mask substrate 1. In the case of the present embodiment, a mask having quite fine patterns can be fabricated because the distance between the electrode 2 and the substrate 1 is very small.

(Embodiment 4)

An embodiment of a method of repairing a photolithographic mask according to the invention is next described.

Figure 5:
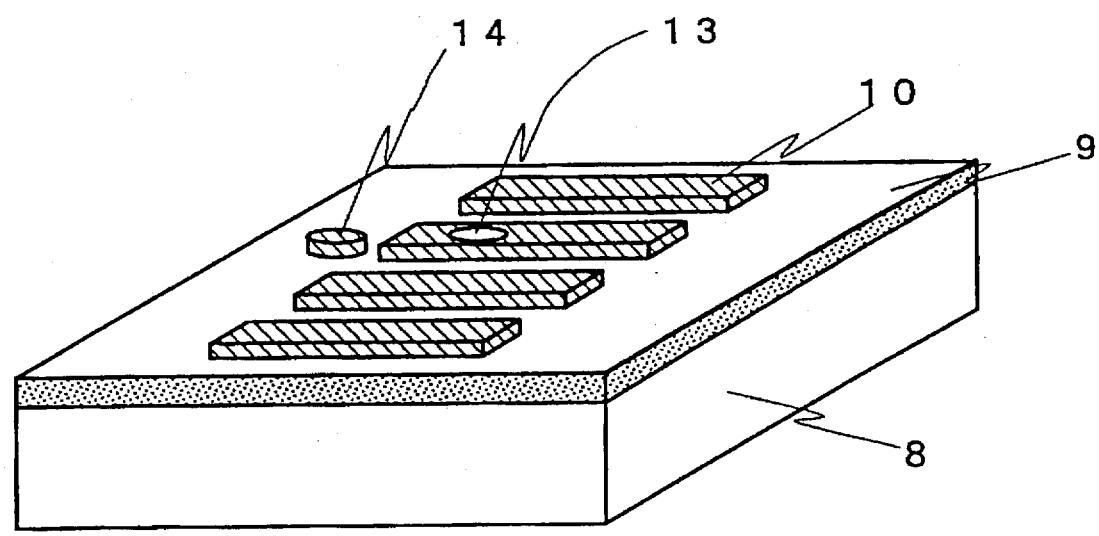
FIG. 5 is a schematic view of one embodiment of a mask used in a repairing method according to the present invention for photolithography.

FIG. 5 pictorially shows an embodiment of a structure of a mask substrate used for the novel method for repairing a photolithographic mask. A thin film of ITO 9 which is a thin transparent conductive film is formed on a glass substrate 8 by sputtering. The thickness of the ITO thin film 9 is 200 nm. In the present embodiment, the transparent conductive material is ITO. Other materials such as tin oxide and zinc oxide can be used without difficulty. Furthermore, other methods such as vacuum evaporation can be used to form the thin film.

The film thickness is such that pinholes are not generated, nor does the film greatly hinder transmission of light. A pattern of a thin chromium film 10 is created on the ITO film. The material of the thin film 10 is not limited to chromium. Other electrically conductive materials such as nickel and aluminum may also be used.

The used electrolytic solution 5 is obtained by dissolving 450 g of nickel sulfamate and 30 g of boric acid in 1 liter of deionized water. In the present embodiment, in order to repair clear defects, nickel is deposited as an opaque material and so an electrolytic solution of the above-described composition is used. Where nickel is also deposited, an electrolytic solution of a different composition may also be used. Furthermore, an electrolytic solution containing ions of other metal such as chromium may also be used.

First, the working electrode 2 is moved by the stage 3 into a position on the surface of the mask substrate 1 where a clear defect 13 is present. The space between the mask substrate 1 and the working electrode 2 is made sufficiently small. Then, an electrical current is supplied between the substrate 1 and the electrode 2 by the current/voltage control unit 4 to deposit nickel on the clear defect portion 13.

At this time, the electrical current flowing between both electrodes can be either a constant current or a pulsed current. In the present embodiment, a pulsed current is supplied because it can provide a higher pattern resolution. These operations are repeated so that the clear defect 13 on the mask substrate 1 can be repaired.

(Embodiment 5)

Another embodiment of the novel photolithography is described now. In the same way as in Embodiment 4, using the apparatus shown in FIG. 1, an opaque defect portion 14 on the mask substrate shown in FIG. 5 is repaired.

The used electrolytic solution is obtained by dissolving 135.3 g of sulfamic acid and 30 g of boric acid in 1 liter of deionized water. In the present embodiment, in order to dissolve chromium, an electrolytic solution of the above-described composition is used. An electrolytic solution of a different composition may also be used. Of course, where a material other than chromium is used as an opaque material, an electrolytic solution of a composition suited to the selected material is used.

The method of repairing the mask is precisely the same as Embodiment 4. Using the apparatus of the construction shown in FIG. 1, the working electrode 2 is first moved by the stage 3 into the opaque defect portion 14 on the surface of the mask substrate 1. The space between the mask substrate 1 and the working electrode 2 is made sufficiently small. Then, an electrical current is passed between the substrate 1 and the electrode 2 by the current/voltage control unit 4 to dissolve chromium from the opaque defect portion on the surface of the mask substrate 1.

At this time, the electrical current flowing between both electrodes can be either a constant current or a pulsed current. In the present embodiment, a pulsed current is supplied because it can provide a higher pattern resolution. These operations are repeated so that the opaque defect 14 on the mask substrate 1 can be repaired.

(Embodiment 6)

An embodiment of a method of repairing the novel photo-lithographic mask by the use of the apparatus shown in FIG. 4 is now described.

In the present embodiment, a mask substrate of the construction shown in FIG. 5 and an electrolytic solution of the same composition as used in Embodiment 5 are employed.

First, the working electrode 2 is moved by the stage 3 into a position on the surface of the mask substrate 1 where a repair is to be made. Then, a switch 11 is switched to the state for establishing the distance-measuring mode. Under this condition, the mask substrate 1 and the working electrode 2 are electrically connected with a tunneling current detecting unit 12. The stage 3 is driven in the direction of the Z-axis until a certain tunneling current is detected. In this way, the working electrode 2 is brought close to the mask substrate 1. This mechanism makes it possible to control the distance between the substrate 1 and the electrode 2 at an accuracy of the order of nanometers.

Thereafter, the switch 11 is switched to the state for establishing the working mode. An electrical current is passed between the substrate 1 and the electrode 2 to dissolve chromium from the opaque defect portion 12 on the surface of the substrate 1. At this time, the electrical current flowing between both electrodes can be either a constant current or a pulsed current. In the present embodiment, a pulsed current is supplied because it can provide a higher pattern resolution. These operations are repeated so that the opaque defect portion 12 on the mask substrate 1 can be repaired.

In the case of the present embodiment, defects in a mask having quite fine patterns can be fabricated because the distance between the electrode 2 and the substrate 1 is very small.

What is claimed is:

1. A method of forming a mask for photolithography, comprising the steps of:

forming a transparent film having an electrical conductivity on a substrate which is transparent to light;

immersing the substrate and an electrode having a sharp front end in an electrolytic solution;

bringing the sharp front end of the electrode close to the transparent film;

controlling a distance between the sharp front end of the electrode and a portion of the transparent film by detecting a tunneling current flowing therebetween;

scanning the substrate and the electrode relative to each other in two dimensions while maintaining the distance between the sharp front end of the electrode and the transparent film constant; and processing an electrochemical reaction on the substrate while applying a voltage between the transparent film and the electrode to form a mask pattern on the substrate.

2. A method of forming a mask for photolithography according to claim 1; wherein the processing step comprises forming an opaque pattern on the transparent film by depositing a material contained in the electrolytic solution onto the transparent film while applying a voltage between the transparent film and the electrode.

3. A method of forming a mask for photolithography according to claim 1; wherein the processing step comprises fabricating a mask pattern formed of an opaque material having a desired two-dimensional shape, and repairing a desired portion of the mask pattern while applying a voltage between the transparent film and the electrode to electrochemically deposit an opaque material from the electrolytic solution onto the transparent film.

4. A method of forming a mask for photolithography according to claim 1; wherein the processing step comprises fabricating a mask pattern formed of an opaque material having a desired two-dimensional shape, and repairing a desired portion of the mask pattern while applying a voltage between the transparent film and the electrode to electrochemically dissolve an opaque material from the mask pattern into the electrolytic solution.

5. A method of forming a mask for photolithography according to claim 1; wherein the scanning step comprises moving the electrode relative to the substrate.

6. A method of forming a mask for photolithography according to claim 1; including the step of applying a pulsed electrical current between the substrate and the electrode after the bringing step but before the controlling step.

7. A method of forming a mask for photolithography, comprising the steps of:

forming a transparent film having an electrical conductivity on a mask substrate which is transparent to light;

forming an opaque conductive film on the transparent film;

immersing in an electrolytic solution an electrode having a sharp front end and the mask substrate having thereon the transparent film and the opaque conductive film;

positioning the sharp front end of the electrode and the opaque conductive film close to one another;

controlling a distance between the sharp front end of the electrode and a desired portion of the opaque conductive film by detecting a tunneling current flowing therebetween;

scanning the mask substrate and the electrode relative to each other in two dimensions; and forming a transparent pattern in the opaque conductive film by electrochemically etching the opaque conductive film.

8. A method of forming a mask for photolithography according to claim 7; wherein the scanning step comprises moving the electrode relative to the mask substrate.

9. A method of forming a mask for photolithography according to claim 7; including the step of applying a pulsed electrical current between the opaque conductive film and the electrode after the bringing step but before the controlling step.

10. A method of repairing a mask for photolithography, comprising the steps of:

providing an electrode having a sharp front end;

immersing the electrode and a mask substrate having an opaque conductive pattern thereon in an electrolytic solution;

positioning the sharp front end of the electrode in close proximity to a portion of the opaque conductive pattern which neighbors on a portion of the opaque conductive pattern which is to be repaired;

controlling a distance between the sharp front end of the electrode and the portion of the opaque conductive pattern neighboring on the portion thereof to be repaired by detecting a tunneling current flowing therebetween; and applying a voltage between the electrode and the opaque conductive pattern for depositing an opaque material onto the portion of the opaque conductive pattern to be repaired.

11. A method of repairing a mask for photolithography according to claim 10; including the step of applying a pulsed electrical current between the sharp front end of the electrode and the portion of the opaque conductive pattern neighboring on the portion thereof to be repaired after the bringing step but before the controlling step.

12. A method of repairing a mask for photolithography, comprising the steps of:

immersing a mask substrate having an opaque conductive pattern thereon and an electrode having a sharp front end in an electrolytic solution;

positioning the sharp front end of the electrode and a portion of the opaque conductive pattern to be repaired in close proximity to one another;

controlling a distance between the sharp front end of the electrode and the portion of the opaque conductive pattern to be repaired by detecting a tunneling current flowing therebetween; and applying a voltage between the electrode and the opaque conductive pattern to electrochemically dissolve an opaque material from the portion of the opaque conductive pattern to be repaired into the electrolytic solution.

13. A method of repairing a mask for photolithography according to claim 12; including the step of applying a pulsed electrical current between the sharp front end of the electrode and the portion of the opaque conductive pattern to be repaired after the bringing step but before the controlling step.

14. A method of forming a mask for photolithography, comprising the steps of:

forming a transparent conductive film on a glass substrate;

forming an opaque conductive film on the transparent conductive film;

providing an electrode having a sharp front end;

immersing in an electrolytic solution the electrode and the glass substrate having thereon the transparent conductive film and the opaque conductive film;

positioning the sharp front end of the electrode and the opaque conductive film in close proximity to one another;

controlling a distance between the sharp front end of the electrode and the opaque conductive film;

scanning the glass substrate and the sharp front end of the electrode relative to each other while maintaining the distance between the sharp front end of the electrode and the opaque conductive film constant; and forming a transparent pattern in the opaque conductive film by electrochemically etching the opaque conductive film while applying a voltage between the opaque conductive film and the electrode.

15. A method of forming a mask for photolithography according to claim 14; wherein the scanning step comprises moving the sharp front end of the electrode relative to the substrate.

16. A method of forming a mask for photolithography according to claim 14; wherein the distance between the sharp front end of the electrode and the opaque conductive film is controlled by detecting a tunneling current therebetween.

* * * * *